United States Patent
Aderhold et al.

(10) Patent No.: US 12,169,098 B2
(45) Date of Patent: Dec. 17, 2024

(54) RTP SUBSTRATE TEMPERATURE ONE FOR ALL CONTROL ALGORITHM

(71) Applicant: Applied Materials, Inc., Santa Clara, CA (US)

(72) Inventors: Wolfgang Aderhold, Santa Clara, CA (US); Yi Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 179 days.

(21) Appl. No.: 17/090,696

(22) Filed: Nov. 5, 2020

(65) Prior Publication Data

US 2022/0136772 A1    May 5, 2022

(51) Int. Cl.
| | |
|---|---|
| H01L 21/67 | (2006.01) |
| F27B 17/00 | (2006.01) |
| F27D 19/00 | (2006.01) |
| F27D 21/00 | (2006.01) |

(52) U.S. Cl.
CPC .......... *F27B 17/0025* (2013.01); *F27D 19/00* (2013.01); *F27D 21/0014* (2013.01); *H01L 21/67109* (2013.01); *H01L 21/67248* (2013.01)

(58) Field of Classification Search
None
See application file for complete search history.

(56) References Cited

U.S. PATENT DOCUMENTS

| | | | |
|---|---|---|---|
| 5,841,110 A | 11/1998 | Nenyei et al. | |
| 6,151,446 A * | 11/2000 | Hunter | H01L 21/67115 392/416 |
| 2006/0292895 A1 * | 12/2006 | Tsai | H01L 21/67248 438/795 |
| 2008/0000551 A1 | 1/2008 | Sato et al. | |
| 2008/0228308 A1 * | 9/2008 | Phelps | H01L 21/67248 700/121 |
| 2010/0054720 A1 | 3/2010 | Hunter et al. | |

(Continued)

FOREIGN PATENT DOCUMENTS

| | | |
|---|---|---|
| CN | 102217048 A | 10/2011 |
| JP | 2001514441 A | 9/2001 |

(Continued)

OTHER PUBLICATIONS

KR 20000020758 A English translation (Year: 2000).*

(Continued)

*Primary Examiner* — Michael G Hoang
*Assistant Examiner* — Kurt J Wolford
(74) *Attorney, Agent, or Firm* — Schwabe, Williamson & Wyatt, P.C.

(57) ABSTRACT

Embodiments disclosed herein include a method of processing a substrate. In an embodiment, the method comprises detecting one or more substrate parameters of a substrate in a processing chamber, and heating the substrate to a first temperature with an open loop tuning (OLT) heating process based on the one or more substrate parameters. In an embodiment, the method may further comprise placing the substrate on an edge ring, and heating the substrate to a second temperature with a low temperature closed loop controller. In an embodiment, the method further comprises heating the substrate to a third temperature with a high temperature closed loop controller.

12 Claims, 5 Drawing Sheets

(56) References Cited

U.S. PATENT DOCUMENTS

| | | | |
|---|---|---|---|
| 2011/0123178 A1 | 5/2011 | Aderhold et al. | |
| 2014/0003800 A1* | 1/2014 | Ramamurthy | .... H01L 21/67115 |
| | | | 392/416 |
| 2014/0113458 A1 | 4/2014 | Pan et al. | |
| 2015/0170934 A1* | 6/2015 | Aderhold | .......... H01L 21/67248 |
| | | | 438/7 |
| 2015/0340257 A1 | 11/2015 | Brillhart et al. | |
| 2020/0343147 A1* | 10/2020 | Rieske | .................. H01L 21/268 |

FOREIGN PATENT DOCUMENTS

| | | | |
|---|---|---|---|
| JP | 2007067196 A | | 3/2007 |
| JP | 2011514660 A | | 5/2011 |
| JP | 2012501548 A | | 1/2012 |
| JP | 2013511848 A | | 4/2013 |
| JP | 2017521874 A | | 8/2017 |
| KR | 20000020758 A | * | 4/2000 |
| KR | 10-2011-0027828 | | 3/2011 |
| KR | 1020110046578 | | 5/2011 |
| KR | 1020120084807 | | 7/2012 |
| KR | 10-2013-0132263 | | 12/2013 |
| KR | 10-2015-0107090 | | 9/2015 |
| TW | 200741882 A | | 11/2007 |
| WO | WO-2006087777 A1 * | 8/2006 | ......... H01L 21/2686 |
| WO | 2009099776 A1 | | 8/2009 |

OTHER PUBLICATIONS

WO-2006087777-A1 English translation (Year: 2006).*
International Search Report and Written Opinion from Patent Application No. PCT/US2021/053536 dated Jan. 26, 2022, 10 pgs.
International Preliminary Report on Patentability from PCT/US2021/053536 dated May 19, 2023, 7 pgs.
Official Letter from Taiwan Patent Application No. 110140728 dated Feb. 19, 2024, 18 pgs.
Notice of Reasons for Rejection from Japanese Patent Application No. 2023-526529 dated Aug. 6, 2024, 10 pgs.
Notice of Preliminary Rejection for Korean Patent Application No. 10-2023-7018642, dated Oct. 7, 2024, 10 pgs.

* cited by examiner

RTP SUBSTRATE TEMPERATURE ONE FOR ALL CONTROL ALGORITHM

BACKGROUND

1) Field

Embodiments of the present disclosure pertain to the field of semiconductor processing and, in particular, to rapid thermal processing (RTP) control algorithms and systems to improve robustness and throughput.

2) Description of Related Art

Rapid thermal processing (RTP) is a semiconductor processing method that allows for the conformal deposition of a film (e.g., oxides, nitrides, etc.) over three-dimensional features on a semiconductor substrate, such as a silicon wafer. The ability to form a conformal film over three-dimensional features has resulted in the increased use of RTP as the complexity of semiconductor devices continues to increase. Currently, the processing engineer is faced with the difficult task of choosing from a list of process control settings in order to provide a desired outcome (e.g., film thickness, thickness uniformity, film composition, etc.). The process control settings may include, but are not limited to, a list of closed loop controllers, open loop options, recipe step options, and end conditions. Depending on the options selected, throughput may also be increased or decreased.

Accordingly, the process engineer is faced with an overwhelming number of options that need to be correctly chosen in order to provide the necessary device outcomes while maintaining an acceptable throughput. Choosing the proper process control settings is further increased in complexity because each incoming wafer may have different substrate characteristics. For example, non-uniformity between wafers may include differences in thermal absorption, front side reflectivity, and dopant concentration, to name a few.

In addition to conformal deposition processes, RTP can be used for many other processing operations in semiconductor manufacturing process flows. For example, RTP may be used for dopant activation, metal reflow, and/or metal annealing. Similar to the case of conformal deposition, many different process control settings need to be controlled in order to provide a desired outcome on the wafer or device. The control settings are typically chosen by the process engineer. As such, the desired outcome on the wafer or device is dependent on the skill and experience of the process engineer. Similarly, non-uniformities between substrates may also result in non-uniform outcomes when a single set of process control settings are used to process each lot of substrates.

SUMMARY

Embodiments disclosed herein include a method of processing a substrate. In an embodiment, the method comprises detecting one or more substrate parameters of a substrate in a processing chamber, and heating the substrate to a first temperature with an open loop tuning (OLT) heating process based on the one or more substrate parameters. In an embodiment, the method may further comprise placing the substrate on an edge ring, and heating the substrate to a second temperature with a low temperature closed loop controller. In an embodiment, the method further comprises heating the substrate to a third temperature with a high temperature closed loop controller.

Embodiments disclosed herein may include a rapid thermal processing (RTP) tool. In an embodiment, the RTP tool comprises a processing chamber, and an edge ring in the processing chamber. The RTP tool may further comprise lift pins for lowering and raising a substrate onto and off of the edge ring, and a sensor for determining substrate parameters of the substrate. In an embodiment, a lamp assembly is provided over the processing chamber. In an embodiment, the RTP tool further comprises a controller for controlling a temperature of the substrate in the chamber. In an embodiment, the controller is communicatively coupled to the lamp assembly, the sensor, and the lift pins. In an embodiment, the controller comprises an algorithm for selecting temperature controllers for various temperature regimes based on the substrate parameters determined by the sensor.

Embodiments disclosed herein may further comprise a method for depositing a film on a substrate with a rapid thermal processing (RTP) tool. In an embodiment, the method comprises detecting one or more substrate parameters of a substrate in a processing chamber using transmission pyrometry. In an embodiment, the one or more substrate parameters include one or more of thermal absorption, front side reflectivity, and doping concentration. In an embodiment, the method further comprises heating the substrate to a first temperature with an open loop tuning (OLT) heating process based on the one or more substrate parameters, and placing the substrate on an edge ring. In an embodiment, the method further comprises heating the substrate to a second temperature with a low temperature closed loop controller, In an embodiment, the substrate is opaque at the second temperature. The method may further comprise heating the substrate to a third temperature with a high temperature closed loop controller, and flowing a processing gas into the processing chamber while the substrate is at the third temperature. In an embodiment, the method may further comprise cooling the substrate to a fourth temperature, and lifting the substrate off of the edge ring.

DETAILED DESCRIPTION

Rapid thermal processing (RTP) control algorithms and systems to improve robustness and throughput are described herein. In the following description, numerous specific details are set forth, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above, the robustness and throughput of currently existing RTP tools is largely limited by the skill of the process engineer responsible for selecting the process control settings. Additionally, the complexity of choosing the proper process control settings is further increased by non-uniformity between wafers. As such, embodiments disclosed herein include RTP control algorithms and systems that improve the robustness and throughput of a given RTP process.

In an embodiment, the proper process control settings are dictated by one or more substrate parameters that are determined by the RTP tool. For example, processes such as transmission pyrometry can be used to determine dopant concentration of the substrate and/or reflectivity measurements may be made by the RTP tool. Such measurements may be made rapidly (e.g., in approximately 1 second or less) and does not significantly decrease the throughput. Once the one or more substrate parameters have been detected a control algorithm is able to select one or more process control settings that provides a desired output with a predictable throughput. In some embodiments, the process engineer may be responsible for minimal inputs to the system, such as soak temperature and time.

Figure 1:
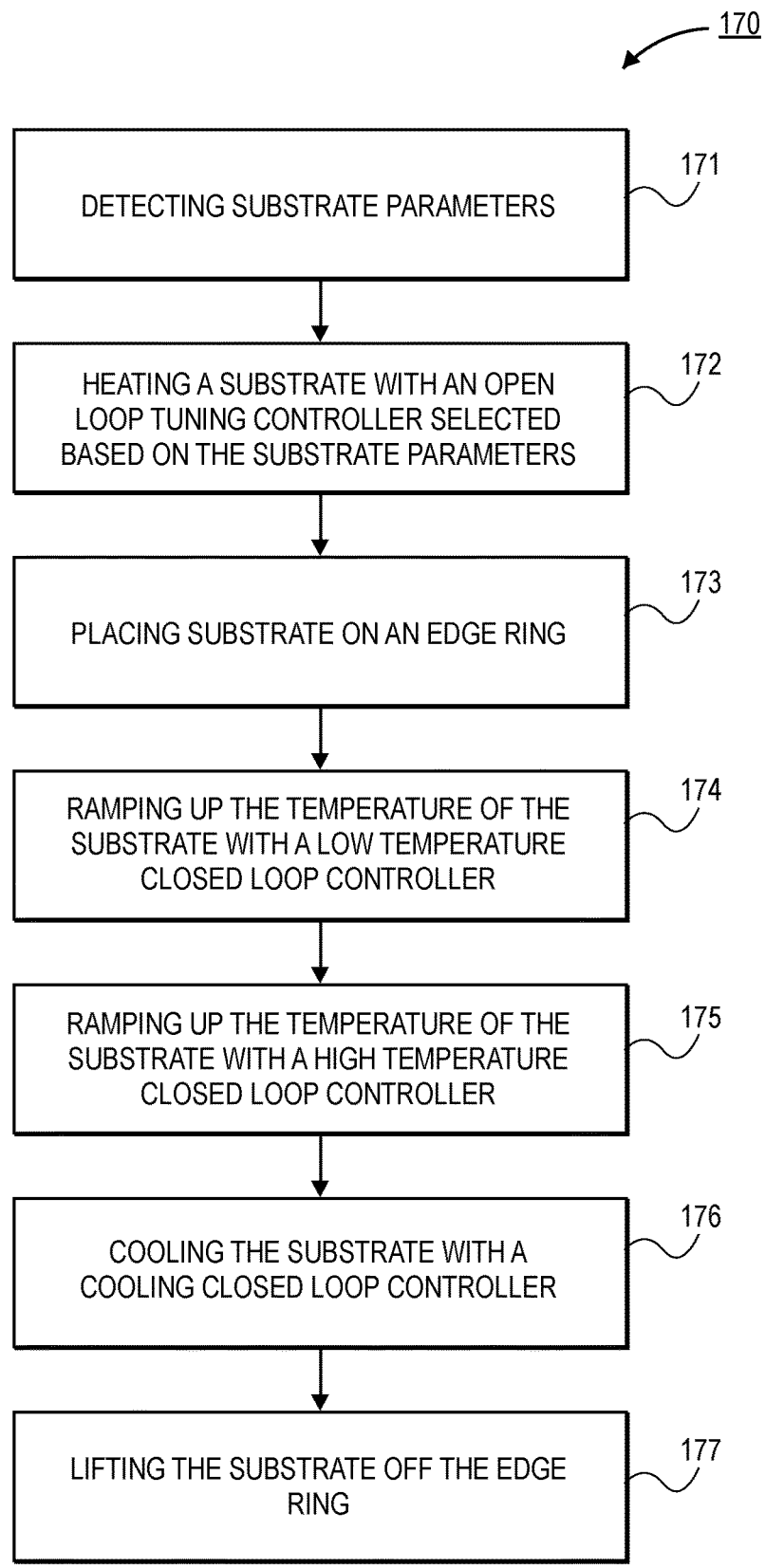
FIG. 1 is a process flow diagram that depicts a rapid thermal processing (RTP) operation that is implemented with the assistance of a control algorithm that uses detected substrate parameters as an input, in accordance with an embodiment.

Referring now to FIG. 1 a process flow diagram 170 depicting a process for implementing an RTP operation on a substrate is shown, in accordance with an embodiment. The flow diagram 170 may begin with operation 171 which comprises detecting substrate parameters. In an embodiment, the substrate parameters may include one or more of thermal absorption, front side reflectivity, and dopant concentration. In an embodiment, detecting the substrate parameters may include using one or more non-destructive analysis methods, such as, but not limited to, transmission pyrometry, reflectivity readings, or the like. The use of such analysis methods allows for rapid detection of the substrate parameters. For example, the substrate parameters may be determined in approximately one second or faster. The rapid detection of the substrate parameters allows for each substrate that is being processed to be analyzed. Alternative embodiments may include analyzing one substrate per lot, or substrate analysis may be implemented at any desired frequency.

In an exemplary embodiment, operation 171 may include determining a dopant concentration of the substrate. In an embodiment, the dopant concentration is determined through the use of electromagnetic wavelength transmissions through the substrate. For example, a nominal voltage (e.g., 10V or lower) is applied to heating lamps in the tool over the substrate in order to provide a source of electromagnetic radiation. Particularly, different dopant concentrations will absorb the electromagnetic radiation differently from each other. An electromagnetic radiation detector (e.g., a photodetector) is on the opposite side of the substrate from the heating lamps. The detector may be used to obtain a relative intensity of the electromagnetic radiation that passes through the substrate. The detected intensity can then be compared to a database that includes relationships between intensities and dopant concentrations, in order to provide the dopant concentration for the detected intensity.

In an embodiment, reflectivity measurements may be made at various locations within the processing tool. In a particular embodiment, the reflectivity measurements may be made as the substrate passes through a port into the processing chamber. For example, a light source (e.g., laser, diode, etc.) may illuminate the substrate, and a light detector (e.g., camera, photodiode, etc.) may detect the reflected light. In an embodiment, the light source may be a single wavelength light source, or the light source may include a broad spectrum. In the case of a single wavelength light source, a plurality of light sources with different wavelengths may be used to provide reflectivity readings at different wavelengths.

In an embodiment, the flow diagram 170 may continue with operation 172 which comprises heating the substrate with an open loop tuning (OLT) controller that is selected based on the substrate parameters. Open loop tuning generally describes a process for increasing the temperature of the substrate following an empirically derived algorithm. In an embodiment, selecting the OLT controller based on the substrate parameters may be done by a control algorithm that is integrated with the RTP tool.

In the instance where dopant concentration of the substrate has been detected at operation 171, the selected OLT controller is optimized to provide controlled heating of the substrate based on the amount of electromagnetic radiation absorbed by the substrate. For example, substrates with low dopant concentrations will absorb less energy than substrates with high dopant concentrations. In a particular embodiment, substrates with a doping level of 1 E18 atoms/$cm^3$ and lower may absorb substantially the same amount of energy, and substrates with a doping level of 1 E20 atoms/$cm^3$ or higher may absorb substantially the same amount of energy. As such, a first OLT controller may be selected for any substrate with a doping level of 1 E18 atoms/$cm^3$ or lower, and a second OLT controller may be selected for any substrate with a doping level of 1 E20 atoms/$cm^3$ or higher.

In an embodiment, the first OLT controller may comprise substantially non-uniform lamp voltages between different radial zones of lamps in the tool. For example, a central zone of the lamps may have a higher voltage than an outer zone of the lamps. The non-uniform voltages allow for uniform heating of the substrate. In an embodiment, the second OLT controller may comprise substantially uniform lamp voltages between different radial zones of lamps in the tool.

In between doping levels of 1 E18 atoms/$cm^3$ and 1 E20 atoms/$cm^3$ the absorption of energy is more variable. That is, small changes in dopant concentration may result in significant changes in the level of absorbed electromagnetic radiation. As such, a plurality of OLT controllers may be provided for the doping levels between 1 E18 atoms/$cm^3$ and 1 E20 atoms/$cm^3$. In the plurality of OLT controllers, the constant lamp voltages in the OLT recipe will vary iteratively between the settings of the first OLT controller and the second OLT controller. That is, at doping levels proximate to 1 E18 atoms/$cm^3$ there will be a spread between the voltages of the inner region of lamps and the outer region of lamps, and the spread between the voltage of the inner region of lamps and the outer region of lamps will converge as the doping level approaches 1 E20 atoms/$cm^3$. The plurality of OLT controllers for doping levels between 1 E18 atoms/$cm^3$ and 1 E20 atoms/$cm^3$ may be empirically or computationally derived and stored in a database available to the control algorithm that is integrated with the RTP tool.

In an embodiment, the control of substrate temperature with the OLT controller is implemented before the substrate is placed on an edge ring. That is, the OLT controller may be used while the substrate is supported by lift pins above the edge ring. As such, the beginning process of heating the substrate is allowed to be carried out separately from the heating of the edge ring. In some embodiments, an endpoint of the use of the OLT controller may be a fixed time endpoint. Using a fixed time endpoint allows for the throughput to be repeatable between substrates, even when the substrates have different substrate parameters. In an embodiment, the use of the OLT controller may heat the substrate to a first temperature. The first temperature may be a temperature where the substrate is still transparent to infrared (IR) electromagnetic radiation. For example, the first temperature may be approximately 300° C. or lower. In some embodiments, substrate parameters may be measured again during operation 172.

In an embodiment, the flow diagram 170 may continue with processing operation 173 which comprises placing the substrate on an edge ring in the processing chamber. The substrate may be placed on the edge ring by lowering the substrate by retracting lift pins on which the substrate is supported during operations 171 and 172. The edge ring may support the substrate so that it is raised above a bottom surface of the chamber, such as a reflector plate. The reflector plate allows for the backside surface of the substrate to be heated in addition to the front side surface during one or more of the processing operations.

In an embodiment, the flow diagram 170 may continue with processing operation 174, which comprises ramping up the temperature of the substrate to a second temperature with a low temperature closed loop controller. Close loop control of the temperature of the substrate typically refers to a linear increase in the temperature of the substrate. The low temperature closed loop controller may be a controller selected from a group of available low temperature controllers. That is, the control algorithm integrated with the RTP tool may select one of the low temperature closed loop controllers based on the substrate parameters that were determined in previous processing operations. The different low temperature closed loop controllers may provide different ramp rates used to heat the substrate from the first temperature to the second temperature, with the selected low temperature closed loop controller providing the most optimum ramp rate suitable for the given substrate parameters.

In an embodiment, all of the wafer information and recipe information is integrated together in order to automatically assign a low temperature controller for the substrate heating process. The process engineer may have various customized recipes for different product wafers. As such, the second temperature may vary (e.g., from between 450° C. and 600° C.). If a single low temperature controller were used, the low temperature controller may work well for a second temperature (e.g., 550° C.) but would cause a big temperature spread or overshoot if another recipe has a different second temperature (e.g., 450° C.). Additionally, some applications may require a low thermal budget for the low temperature controller that is followed by a fast spike. That is to say, one low temperature controller does not fit the many different heating requirements. As such, the selected low temperature controller may be dependent on the one or substrate parameters and heating requirements selected by the process engineer. The auto-assigned low temperature controller will help to modify control parameters and optimize the control algorithm for different second temperatures in various recipes in under a second. As such, the process engineer will not have any trouble with assigning a wrong controller or needing to test all of the different low temperature controllers.

In an embodiment, the second temperature may be a temperature where the substrate has transitioned from transparent to opaque. For example, in the case of a silicon substrate, the second temperature may be greater than approximately 550° C. In another embodiment, the second temperature may be between approximately 550° C. and approximately 650° C.

In an embodiment, flow diagram 170 may continue with operation 175, which comprises ramping up the temperature of the substrate to a third temperature with a high temperature closed loop controller. The high temperature closed loop controller may be recipe dependent. That is, in some embodiments, the selection of the high temperature closed loop controller may not be dependent on the substrate parameters. However, in some embodiments, the selection of the high temperature closed loop controller may be informed by the substrate parameters. In an embodiment, the third temperature may be above approximately 1,000° C. In a particular embodiment, the third temperature may be between approximately 1,000° C. and approximately 1,200° C.

In an embodiment, the high temperature closed loop controller may include a soak ramp rate or a spike ramp rate. A soak ramp rate is typically smaller than a spike ramp rate. For example, a soak ramp rate may be approximately 75° C. per second, and a spike ramp rate may be approximately 200° C. per second. The selection of the high temperature closed loop controller may be selected by the process engineer. In embodiments where the high temperature closed loop controller selection is informed by the substrate parameters, the control algorithm may be used to make the selection. In an embodiment, the high temperature closed loop controller follows a fixed ramp up setpoint. Such a fixed ramp up setpoint allows for the heating of the substrate in an optimized way, without unnatural lamp power spikes.

In an embodiment, the flow diagram 170 may continue with operation 176, which comprises cooling the substrate with a cooling closed loop controller. The cooling may be implemented while the substrate is still on the edge ring. In an embodiment, the cooling may be executed until a fourth temperature is reached. For example, the fourth temperature may be approximately 850° C. or lower.

After the fourth temperature is reached, flow diagram 170 may continue with operation 177, which comprises lifting the substrate off of the edge ring with the lift pins. Once off of the edge ring, the closed loop controller may continue with cooling the substrate to a desired temperature. In an embodiment, the process engineer may choose the fourth temperature. In some embodiments, the control algorithm may provide a throughput estimate to the process engineer based on the selected fourth temperature. After the substrate is sufficiently cooled, the substrate may be removed from the RTP chamber.

In the embodiment disclosed above, the heating and cooling of the substrate is disclosed. It is to be appreciated that one or more process gasses may be flowed into the chamber during one or more of the heating and cooling operations in order to form a film over the substrate. In a particular embodiment, the film is a conformal film. The process gas may be any processing gas or gasses suitable to form the layer having a desired composition. For example, in embodiments where the layer is a nitrogen containing layer, the process gas may comprise a nitrogen containing gas, such as, but not limited to a nitrogen gas ($N_2$), ammonia (NH), nitric oxide (NO), nitrous oxide (NO), or the like. In embodiments where the layer is an oxygen containing layer, the process gas may comprise, but is not limited to, hydrogen (H2) and oxygen (O2). The process gas may be provided at any suitable flow rate, for example, about 1 standard liter per minute (slm) to about 5 slm. In some embodiments, the flow rate may be adjusted to control a thickness and/or uniformity of the layer.

In an embodiment, the system implementing flow chart 170 has the capability to provide the process engineer with information on the exact substrate processing time for each lot based on entered parameters, such as soak time and soak temperature. The total recipe time is based on the soak time, the soak temperature, and an overhead time. The overhead time may be the sum of the substrate exchange time and the time needed to heat and cool the wafer to and from the soak temperature. These values may be exactly calculated by simulation. Machine learning algorithms that are fed actual data from the processing of substrates may be used to refine the calculated processing time. In the case where the actual values deviate from either the calculated values or a reference value (e.g. data from a previous lot of similar substrates), corrections are suggested and transmitted to automation software. The automation software can control the processing tool in order to bring the process recipe back to the calculated or reference values.

In an embodiment, the suggested corrections from the automation software may include altering the robot speed if the wafer exchange time is different than expected. The corrections may also include checking the selected OLT tuner in cases where the time to heat the substrate to the first and second temperatures are different than expected. Corrections may also include rechecking the low temperature controller parameters (e.g., dopant concentration or reflectivity). Based on the substrate parameters and context information, such as recipe parameters, the automation software will decide to modify robot instructions or the OLT controller to address the suggestions from system. That is, some lots might have new wafer parameters that do not have the right optimized OLT and low temp control options. In such instances, the lot is flagged with a different heating time, and a better OLT controller is found to address the issue. In some instances a difference in recipe time is allowed by the automation software.

Figure 2A:
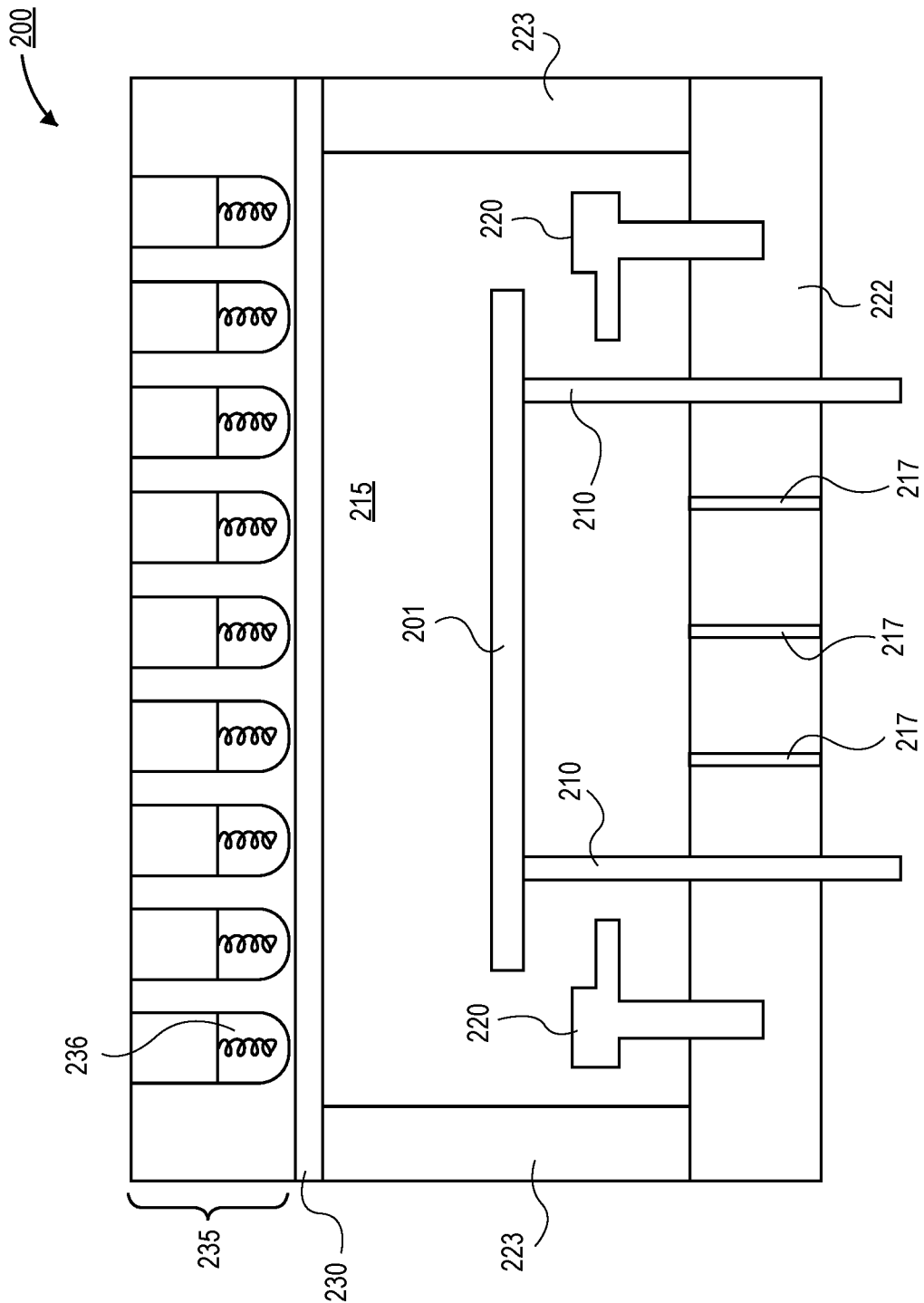
FIG. 2A is a cross-sectional illustration of an RTP tool with a substrate raised on lift pins, in accordance with an embodiment.
Figure 2B:
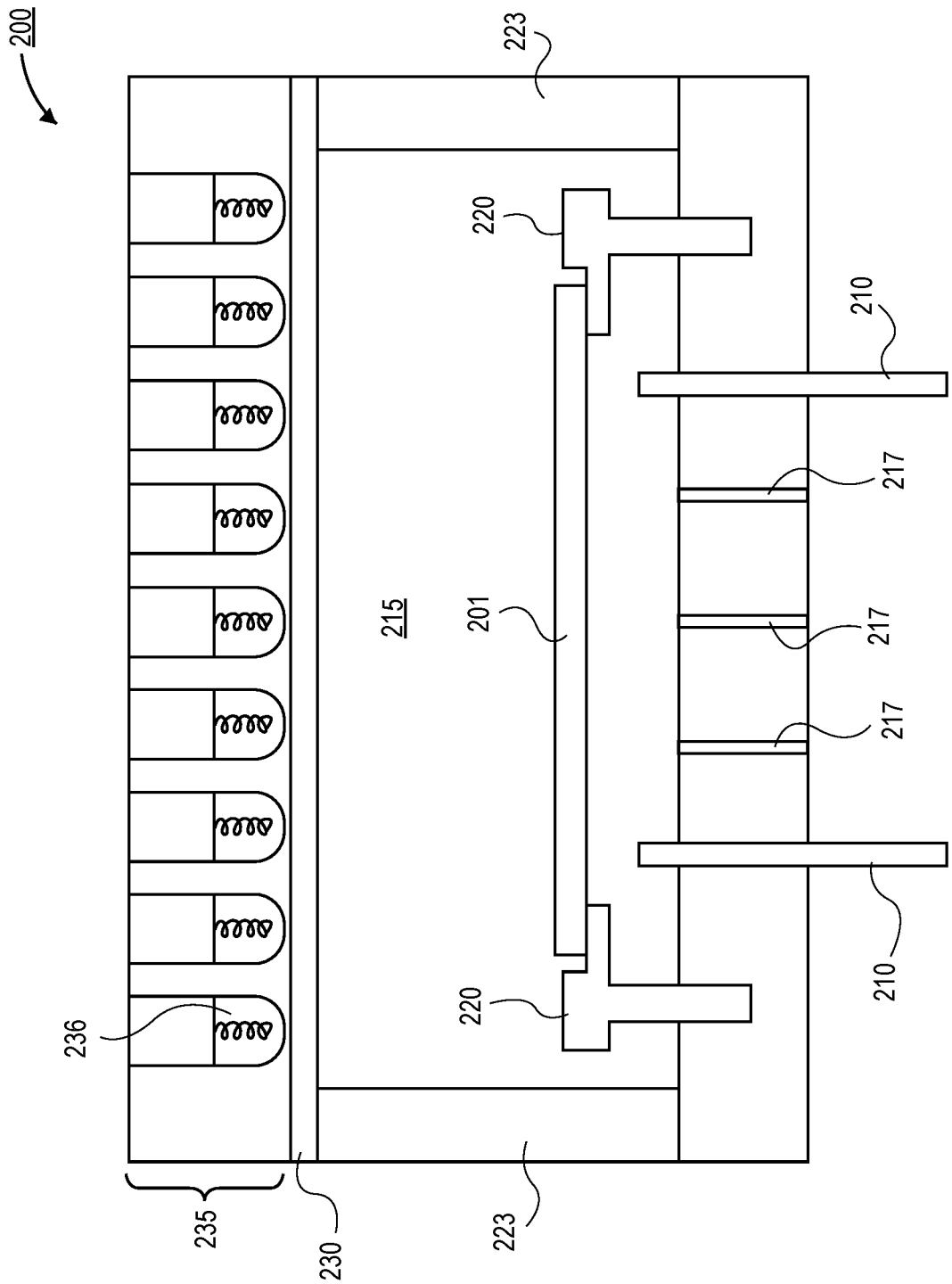
FIG. 2B is a cross-sectional illustration of the RTP tool with the substrate supported by an edge ring within the chamber, in accordance with an embodiment.

Referring now to FIGS. 2A and 2B cross-sectional illustrations of an RTP tool 200 that may be used to implement the process of flow diagram 170 are shown, in accordance with various embodiments. In FIG. 2A, the substrate 201 is supported by lift pins 210 above an edge ring 220. In FIG. 2B, the lift pins 210 have been retracted, and the substrate 201 is supported by the edge ring 220.

As shown in FIGS. 2A and 2B, the RTP tool 200 comprises a process region 215. The process region 215 is defined by a reflector plate 222 below the substrate 201, sidewalls 223 and a window 230. The substrate 201 may be inserted into the process region 215 and onto the lift pins 210 through a slit valve (not shown). The lift pins 210 may extend through the reflector plate 222. In an embodiment, the lift pins 210 are actuated by a linear actuator mechanism (not shown). The lift pins 210 may be controlled by a control algorithm (not shown) that is integrated within the RTP tool 200. For example, the control algorithm may dictate when the lift pins 210 are extended and/or retracted in order to place the substrate 201 on the edge ring 220 or raise the substrate 201 off of the edge ring 220.

In an embodiment, the reflector plate 222 comprises a material that reflects energy in order to uniformly heat the substrate 201. That is, the reflector plate 222 reflects energy to a backside of the substrate 201 to facilitate uniform heating of the substrate 201. In some embodiments, one or more sensors 217 may pass through the reflector plate 222 to measure substrate parameters of the substrate. For example, the one or more sensors 217 may comprise sensors for transmission pyrometry or the like.

In an embodiment, the window 230 interfaces with the sidewalls 223 to seal the process region 215. The window 230 comprises a material that is transparent to the energy from one or more lamps 236. For example, the window may be a glass window or the like. In an embodiment, a lamp assembly 235 is provided over the window 230. The lamp assembly 235 comprises a plurality of lamps 236. The lamps 236 may be halogen lamps, such as tungsten halogen lamps. The lamps facilitate rapid heating of the substrate 201. In an embodiment, the lamps 236 may be individually controllable, or controllable in groups. For example, the lamps 236 may be grouped into concentric rings, with each concentric ring being individually controllable. The lamps 236 may be controlled by the control algorithm in order to execute an RTP process on the substrate, such as the process described above with respect to FIG. 1.

In an embodiment, one or more processing gasses may be flowed into the processing region 215. The processing gasses may be flown into the chamber through a cartridge (not shown). For example, the cartridge may be provided through a sidewall 223 of the RTP tool 200. The cartridge may receive gas from one or more gas sources, such as, but not limited to, a nitrogen containing source gas, a hydrogen source gas, and/or an oxygen containing source gas.

Figure 3:
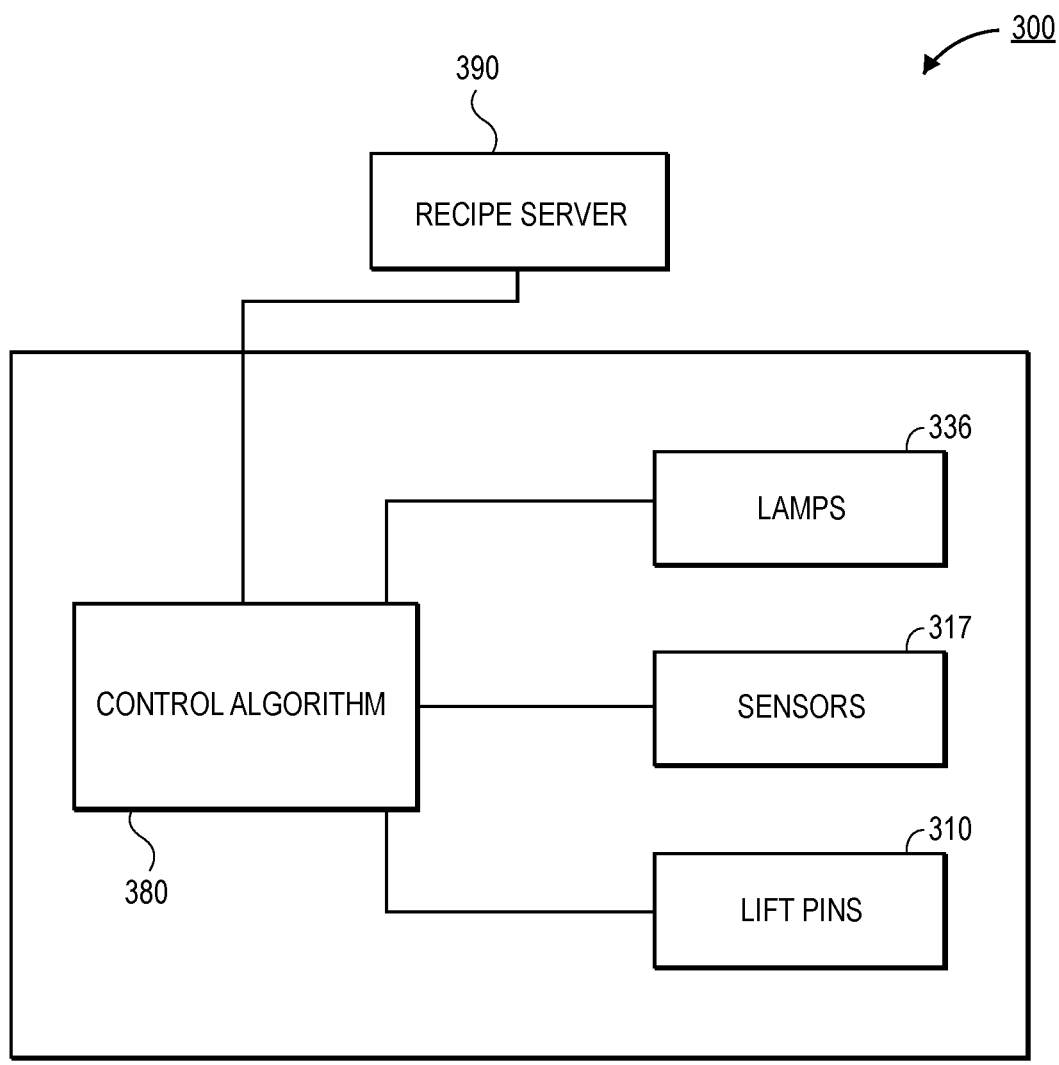
FIG. 3 is a block diagram of an RTP tool that illustrates the control algorithm and some of the features controlled by the control algorithm, in accordance with an embodiment.

Referring now to FIG. 3, a schematic illustration of a RTP tool 300 is shown, in accordance with an embodiment. In an embodiment, the RTP tool 300 may comprise a control algorithm 380. The control algorithm 380 may be a control algorithm suitable for implementing an RTP process such as the RTP process 170 described above with respect to FIG. 1. Particularly, the control algorithm 380 may be communicatively coupled to lamps 336, lift pins 310, and sensors 317. The sensors 317 may be suitable for determining one or more substrate parameters of the substrate being processed in the RTP tool 300. For example, the sensors 317 may include a transmission pyrometer. The sensors 317 may be suitable for determining substrate parameters, such as, but not limited to, thermal absorption, front side reflectivity, and dopant concentration of a substrate.

In an embodiment, the control algorithm 380 obtains the substrate parameters from the sensors 317 as an input and outputs a process recipe that is tailored to the given substrate parameters. For example, the process recipe may include the selection of OLT controllers, low temperature closed loop controllers, and/or high temperature closed loop controllers that provide a desired process outcome with a suitable process throughput. In an embodiment, the different controllers from which the control algorithm makes the selection may be stored in a recipe server 390. The recipe server 390 may be external to the RTP tool 300. However, in other embodiments, the recipe server 390 may be implemented in a memory within the RTP tool 300.

In an embodiment, the control algorithm 380 is also coupled to the lamps 336 and the lift pins 310. As such, the control algorithm 380 is capable of causing the RTP tool 300 to heat and/or cool the substrate, in addition to controlling the placement of the substrate within the RTP tool 300 (e.g., on or off of the edge ring).

The use of a control algorithm 380 has the benefit of simplifying the selections that need to be made by the process engineer. For example, the process engineer may only need to select the soak temperature and time. The control algorithm 380 then automatically generates the remainder of the recipe based on the detected substrate parameters. Accordingly, the complexity of designing an RTP process is decreased.

Figure 4:
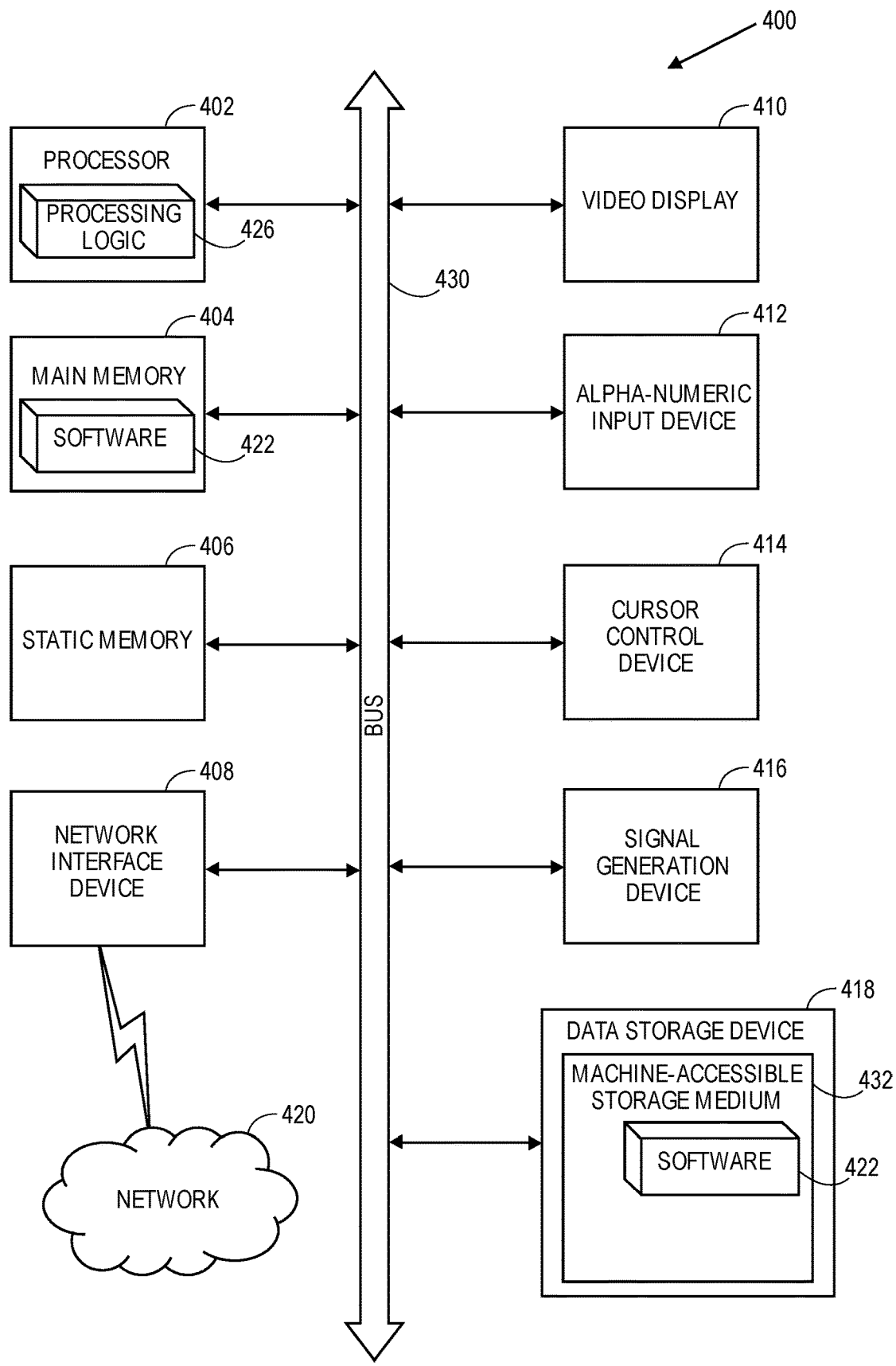
FIG. 4 illustrates a block diagram of an exemplary computer system, in accordance with an embodiment of the present disclosure.

FIG. 4 illustrates a diagrammatic representation of a machine in the exemplary form of a computer system 400 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 400 includes a processor 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), MRAM, etc.), and a secondary memory 418 (e.g., a data storage device), which communicate with each other via a bus 430.

Processor 402 represents one or more general-purpose processing devices such as a microprocessor, central processing unit, or the like. More particularly, the processor 402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 402 may also be one or more special-purpose processing devices such as an application specific integrated circuit (ASIC), a field programmable gate array (FPGA), a digital signal processor (DSP), network processor, or the like. Processor 402 is configured to execute the processing logic 426 for performing the operations described herein.

The computer system 400 may further include a network interface device 408. The computer system 400 also may include a video display unit 410 (e.g., a liquid crystal display (LCD), a light emitting diode display (LED), or a cathode ray tube (CRT)), an alphanumeric input device 412 (e.g., a keyboard), a cursor control device 414 (e.g., a mouse), and a signal generation device 416 (e.g., a speaker).

The secondary memory 418 may include a machine-accessible storage medium (or more specifically a computer-readable storage medium) 432 on which is stored one or more sets of instructions (e.g., software 422) embodying any one or more of the methodologies or functions described herein. The software 422 may also reside, completely or at least partially, within the main memory 404 and/or within the processor 402 during execution thereof by the computer system 400, the main memory 404 and the processor 402 also constituting machine-readable storage media. The software 422 may further be transmitted or received over a network 420 via the network interface device 408.

While the machine-accessible storage medium 432 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a methods of generating and executing a rapid thermal process (RTP) operation using a control algorithm that detects substrate parameters and selects controllers based on the substrate parameters.

Thus, methods and apparatuses for generating and executing a rapid thermal process (RTP) operation using a control algorithm that detects substrate parameters and selects controllers based on the substrate parameters have been disclosed.

What is claimed is:

1. A method of processing a substrate, comprising:
    detecting a dopant concentration of a substrate in a processing chamber, wherein detecting the dopant concentration comprises sending electromagnetic wavelength transmissions through the substrate, detecting an absorption of the electromagnetic wavelength transmissions by the substrate with an electromagnetic radiation detector, and comparing the absorption of the electromagnetic wavelength transmissions by the substrate to a database that includes relationships between intensities and dopant concentrations;
    heating the substrate to a first temperature with an open loop tuning (OLT) heating process, wherein an extent of heating the substrate to the first temperature is determined using an empirically derived algorithm and is based on the detected dopant concentration of the substrate;
    placing the substrate on an edge ring;
    heating the substrate to a second temperature with a lower temperature closed loop controller;
    heating the substrate to a third temperature with a higher temperature closed loop controller, the third temperature between 1,000° C. and 1,200° C., wherein a recipe of the higher temperature closed loop controller is a soak recipe having a soak ramp rate of 75° C. per second;
    cooling the substrate to a fourth temperature of 850° C.; and
    lifting the substrate off of the edge ring at the fourth temperature.

2. The method of claim 1, wherein the dopant concentration of the substrate is detected using transmission pyrometry.

3. The method of claim 2, wherein the transmission pyrometry is implemented in 1 second or less.

4. The method of claim 1, wherein heating the substrate to the first temperature is implemented in a fixed time.

5. The method of claim 1, wherein the second temperature is 650° C. or lower.

6. The method of claim 5, wherein the substrate is opaque at the second temperature.

7. The method of claim 1, wherein the processing chamber is a rapid thermal processing (RTP) chamber.

8. The method of claim 1, wherein the lower temperature closed loop controller for heating the substrate to the second temperature is selected based on the one or more substrate parameters.

9. The method of claim 1, further comprising:
finding deviations in a recipe time of the method of processing the substrate; and
correcting the recipe time by adding more controllers to an existing list, wherein the controllers are based on actual data obtained during the method of processing the substrate.

10. A method for depositing a film on a substrate with a rapid thermal processing (RTP) tool, comprising:
detecting a dopant concentration of a substrate in a processing chamber, wherein detecting the dopant concentration comprises sending electromagnetic wavelength transmissions through the substrate, detecting an absorption of the electromagnetic wavelength transmissions by the substrate with an electromagnetic radiation detector, and comparing the absorption of the electromagnetic wavelength transmissions by the substrate to a database that includes relationships between intensities and dopant concentrations;
heating the substrate to a first temperature with an open loop tuning (OLT) heating process, wherein an extent of heating the substrate to the first temperature is determined using an empirically derived algorithm and is based on the detected dopant concentration of the substrate;
placing the substrate on an edge ring;
heating the substrate to a second temperature with a lower temperature closed loop controller, wherein the substrate is opaque at the second temperature;
heating the substrate to a third temperature with a higher temperature closed loop controller, the third temperature between 1,000° C. and 1,200° C., wherein a recipe of the higher temperature closed loop controller is a soak recipe having a soak ramp rate of 75° C. per second;
flowing a processing gas into the processing chamber while the substrate is at the third temperature;
cooling the substrate to a fourth temperature of 850° C.; and
lifting the substrate off of the edge ring at the fourth temperature.

11. The method of claim 10, wherein the second temperature is 650° C. or lower.

12. The method of claim 10, wherein the detecting the absorption of the electromagnetic wavelength transmissions by the substrate with the electromagnetic radiation detector is implemented in 1 second or less.

* * * * *